(12) United States Patent
Kase

(10) Patent No.: US 7,116,147 B2
(45) Date of Patent: Oct. 3, 2006

(54) CIRCUIT AND METHOD FOR INTERPOLATIVE DELAY

(75) Inventor: Kiyoshi Kase, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 10/967,898

(22) Filed: Oct. 18, 2004

(65) Prior Publication Data

US 2006/0082403 A1 Apr. 20, 2006

(51) Int. Cl.
*H03L 7/06* (2006.01)

(52) U.S. Cl. .................. 327/158; 327/147; 327/161

(58) Field of Classification Search ............. 327/158, 327/149, 152, 153, 161, 261, 266, 272, 274, 327/278, 280
See application file for complete search history.

(56) References Cited

U.S. PATENT DOCUMENTS

| | | | | |
|---|---|---|---|---|
| 5,008,563 | A * | 4/1991 | Kenney et al. | 327/176 |
| 5,175,550 | A | 12/1992 | Kattmann et al. | 341/159 |
| 5,231,320 | A | 7/1993 | Kase | 327/277 |
| 5,521,539 | A * | 5/1996 | Molin | 327/274 |
| 5,777,501 | A * | 7/1998 | AbouSeido | 327/274 |
| 5,945,862 | A * | 8/1999 | Donnelly et al. | 327/278 |
| 5,953,276 | A | 9/1999 | Baker | 365/208 |
| 6,054,884 | A | 4/2000 | Lye | 327/269 |
| 6,169,436 | B1 | 1/2001 | Marbot | 327/270 |
| 6,348,826 | B1 | 2/2002 | Mooney et al. | 327/270 |
| 6,414,557 | B1 * | 7/2002 | Liu | 331/57 |
| 6,539,072 | B1 * | 3/2003 | Donnelly et al. | 375/371 |
| 6,583,655 | B1 * | 6/2003 | Takahashi et al. | 327/160 |
| 6,661,265 | B1 * | 12/2003 | Partsch et al. | 327/276 |
| 6,768,356 | B1 * | 7/2004 | Wu et al. | 327/156 |
| 6,853,225 | B1 * | 2/2005 | Lee | 327/158 |
| 6,900,685 | B1 * | 5/2005 | Silvestri | 327/276 |
| 6,958,634 | B1 * | 10/2005 | Rashid | 327/141 |
| 6,970,029 | B1 * | 11/2005 | Patel et al. | 327/261 |

OTHER PUBLICATIONS

Hamamoto, Takeshi et al.; "A 667-Mb/s Operating Digital DLL Architecture for 512-Mb DDR SDRAM"; IEEE Journal of Solid State Circuits; Jan. 2004; pp. 194-206; vol. 39, No. 1; IEEE.

* cited by examiner

*Primary Examiner*—Timothy P. Callahan
*Assistant Examiner*—Hai L. Nguyen
(74) *Attorney, Agent, or Firm*—Michael P. Noonan; Michael J. Balconi-Lamica

(57) ABSTRACT

A circuit and a method for interpolative delay is provided. The circuit includes a delay locked loop with interpolation delay. The delay locked loop includes a differential inverter, an interpolation circuit, and a differential compare circuit. The differential inverter is coupled to receive a differential clock signal and coupled to provide an inverted differential clock signal. The interpolation circuit is coupled to receive both the clock signal and the inverted clock signal, and to provide an interpolated clock signal having a first delay relative to the clock signal. The differential compare circuit is coupled to receive the inverted clock signal and coupled to provide a non-interpolated clock signal having a second delay relative to the clock signal. The second delay corresponds to a full delay of the differential inverter and the first delay corresponds to a predetermined fraction of the full delay.

38 Claims, 3 Drawing Sheets

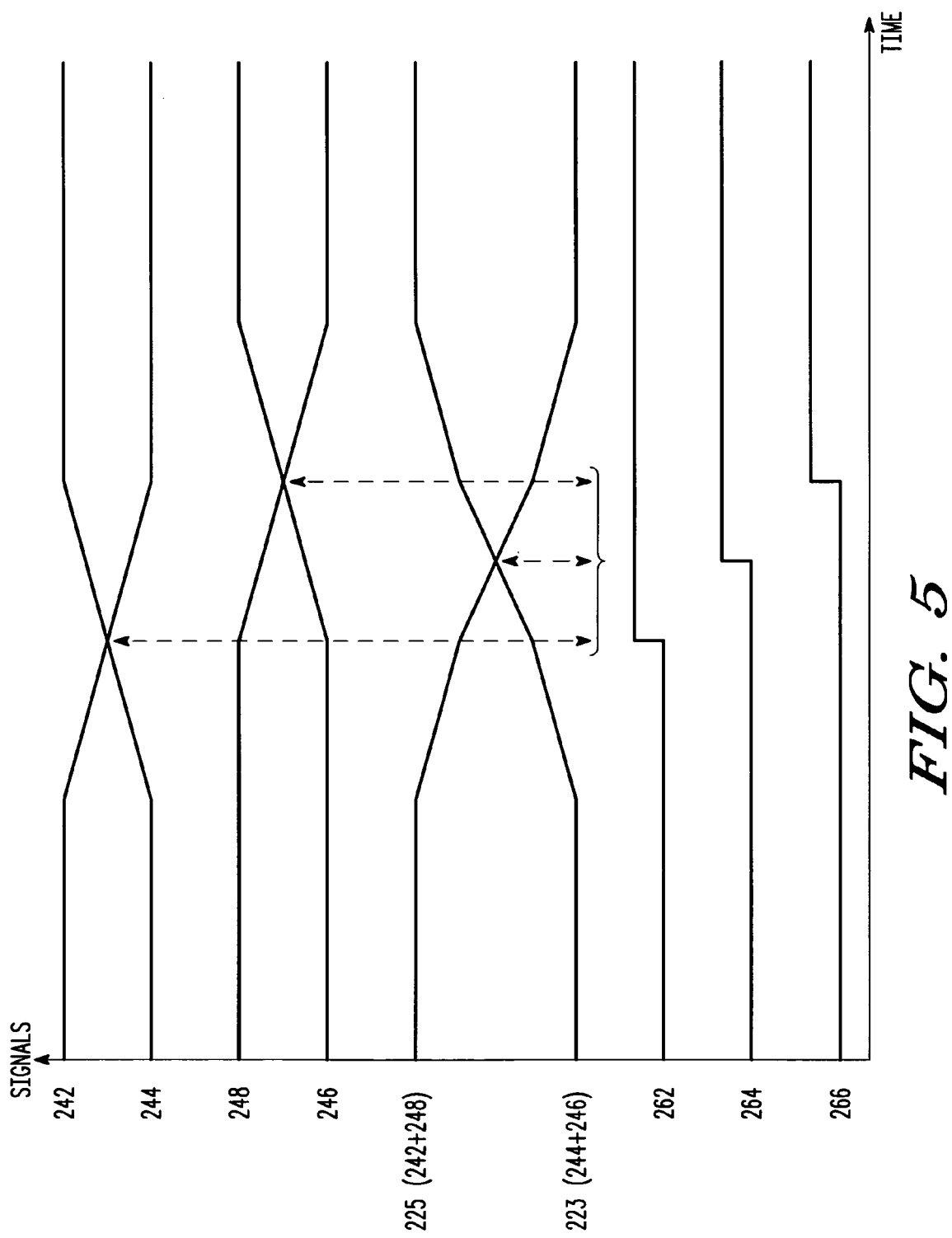

US 7,116,147 B2

CIRCUIT AND METHOD FOR INTERPOLATIVE DELAY

BACKGROUND

1. Field

The present invention relates generally to delay locked loops and more specifically to delay lines in delay locked loops.

2. Description of the Related Art

Electronic devices, such as, for example, digital signal processors, microcontrollers, memory devices, and other input/output devices often require the use of multiple delayed clock signals. Several techniques have been used to generate multiple delayed clock signals, however, many of these techniques do not meet the timing requirements of high-end electronic devices. For example, multiple rate clock generators (MRCG) may use 32 tap delay lines running at a clock rate of up to 1 GHz, requiring less than 30 picoseconds per tap delay. Standard buffer delay lines or custom cells used in processes using standard voltage threshold transistors often do not satisfy this requirement.

Other multiple rate clock generators often utilize an inverter chain with alternative positive and negative logic to increase clock generation speed. However, the inverter chain may introduce uneven phase shift due to asymmetrical rise/fall propagation delay of the inverter chain in conjunction with alternative logic polarity (alternative NOR and NAND usage).

Therefore, the need exists for an improved electronic system design that generates multiple delayed clock signals.

BRIEF DESCRIPTION OF THE DRAWINGS

The present invention is illustrated by way of example and not limitation in the accompanying figures, in which like references indicate similar or possibly even identical elements, and in which:

FIG. 5 illustrates a timing diagram of various signals according to one embodiment of the present invention.

Elements in the figures are illustrated for simplicity and clarity and have not necessarily been drawn to scale.

DETAILED DESCRIPTION OF THE DRAWINGS

The following discussion is intended to provide a detailed description of at least one example of the invention and should not be taken to be limiting of the invention itself. Rather, any number of variations may fall within the scope of the invention which is properly defined in the claims following this description.

Figure 1:
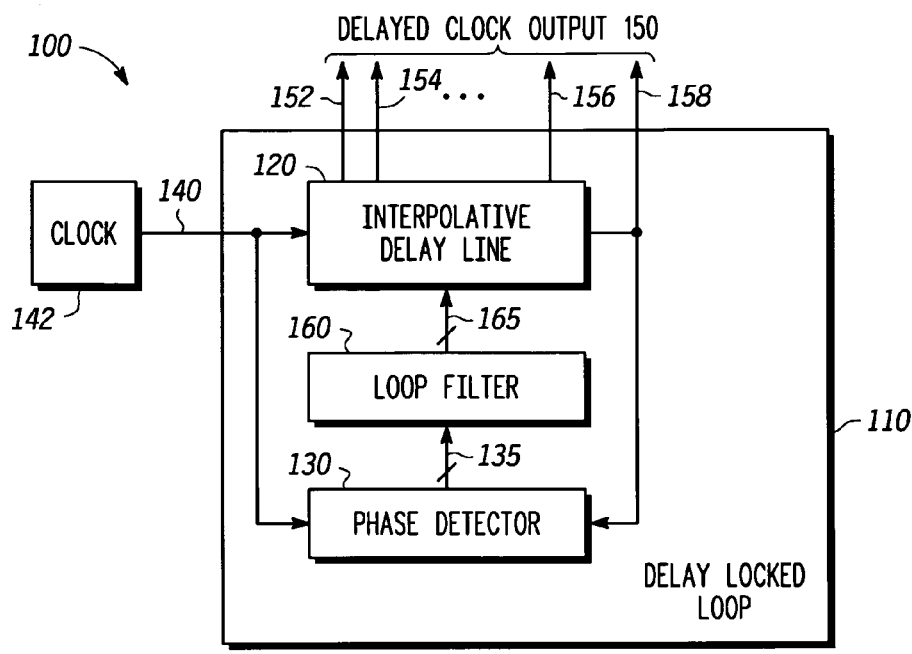
FIG. 1 illustrates, in block diagram form, an electronic system, according to one embodiment of the present invention.

FIG. 1 illustrates an electronic system 100 in accordance with one embodiment of the present invention. Electronic system 100 includes a clock 142 and a delay locked loop 110. In one embodiment, electronic system 100 may include an integrated circuit, wherein the integrated circuit includes delay locked loop 110. Delay locked loop 110 includes an interpolative delay line 120, a loop filter 160, and a phase detector 130. Phase detector 130 is coupled to loop filter 160 and clock 142. Loop filter 160 is coupled to interpolative delay line 120. Clock 142 is coupled to interpolative delay line 120 and phase detector 130.

In one embodiment, during normal operation, interpolative delay line 120 receives clock input signal 140 from clock 142 and loop filter output signals 165 from the output of loop filter 160. In one embodiment, clock input signal 140 may be a differential clock input signal. Interpolative delay line 120 uses clock input 140 and loop filter output signals 165 to generate a plurality of delayed clock output signals 150. The delayed clock input signals 150 may be used by electronic devices, such as, for example, digital signal processors, microcontrollers, memory devices, and other input/output devices (not shown) that require delayed clock signals that vary in delay amounts. In the embodiment shown in FIG. 1, delayed clock output signals 150 includes delayed clock output signal 152, delayed clock output signal 154, delayed clock output signal 156, and delayed clock output signal 158. In other embodiments, delayed clock output signals 150 may include a greater or lesser number of delayed clock output signals. In one embodiment, for example, 32 delayed clock output signals may be used for an electronic system that utilizes a Multiple Rate Clock Generator (MRCG).

In one embodiment, phase detector 130 receives clock input 140 from clock 142 and delayed clock output signal 158 from interpolative delay line 120 and generates a phase indication signal 135 that is provided to loop filter 160. In an alternate embodiment, phase detector 130 may receive delayed clock output signal 152 instead of clock input 140. In one embodiment, phase indication signal 135 indicates the phase relationship between delayed clock output 158 and clock input 140. For example, in one embodiment, phase detector 130 compares the rising edge of clock input 140 to the rising edge of delay clock output 158 and outputs phase indication signal 135 that indicates whether the phase of delayed clock output 158 leads the phase of clock input 140 or lags the phase of clock input 140.

In one embodiment, loop filter 160 receives a plurality of phase indication values from phase detector 130 and averages the phase indication values to generate an average phase indication value. The average phase indication value is output by loop filter 160 as loop filter output signals 165 (output 165) and provided to interpolative delay line 120. In one embodiment, the average phase indication value output by loop filter 160 serves as an indication of the phase difference between clock input 140 and delayed clock output 158. In one embodiment, loop filter output signals 165 are used by interpolative delay line 120 to adjust the delay of delayed clock output signals 150.

In one embodiment, delayed clock output 152, may be, for example, clock input 140 delayed by a fraction of the period of clock input 140. In one embodiment, the fractional period delay of each delayed clock output of delayed clock output 150 is determined using the number of delayed clock output signals in delayed clock output 150. For example, in one embodiment, if the number of delayed clock output signals 150 is 32, the delay of each clock output signal is the period of clock input 140 divided into 32 delay amounts.

Figure 2:
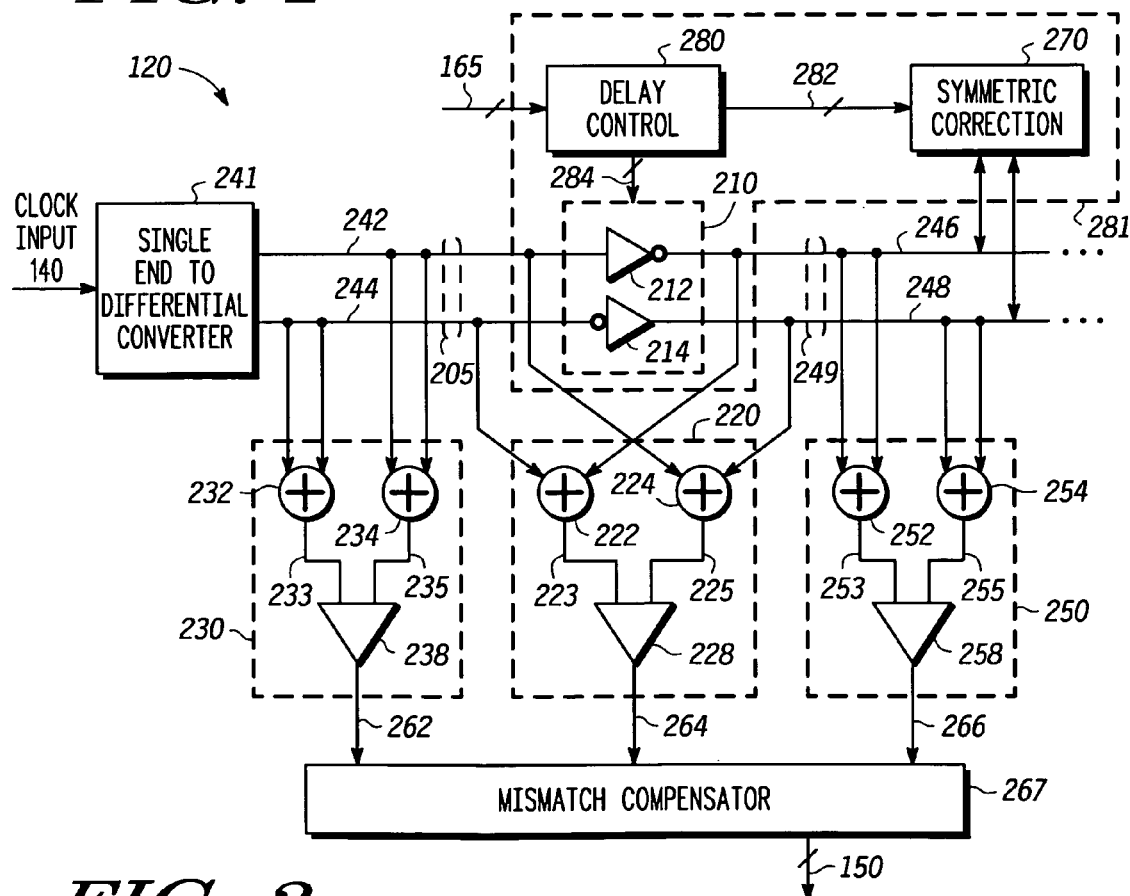
FIG. 2 illustrates, in block diagram form, an interpolative delay line, according to one embodiment of the present invention.

FIG. 2 illustrates a portion of interpolative delay line 120 according to one embodiment of the present invention. Interpolative delay line 120 includes a symmetric delay unit 281, a single-end-to differential converter 241, a full stage delay compare circuit such as differential comparator 230, a fractional stage delay compare circuit such as interpolative comparator 220, a full stage delay compare circuit such as differential comparator 250, and a mismatch compensator 267.

Differential comparator 230 includes a summer 232, a summer 234, and a comparator 238. Differential comparator 250 includes a summer 252, a summer 254, and a comparator 258. Interpolative comparator 220 includes a summer 222, a summer 224, and a comparator 228.

The illustrated differential comparators 230 and 250 are sometimes referred to as a full stage delay compare circuit, or the like. The illustrated interpolative comparator 220 is sometimes referred to as a fractional stage delay compare circuit, or the like. Differential comparator 230 and differential comparator 250 are non-interpolative comparison circuits.

The illustrated fractional stage delay compare circuit 220 and full stage delay compare circuit 250 have substantially matched output impedances. Fractional stage delay compare circuit 220 and full stage delay compare circuit 230 may also have substantially matched output impedances.

Symmetric delay unit 281 includes a delay stage 210, a delay control unit or circuit 280, and a symmetric correction unit 270. Symmetric correction unit 270 is sometimes referred to as a transition symmetry control circuit. In one embodiment, delay stage 210 is a differential buffer. Delay stage 210 includes inverter 212 and inverter 214. In one embodiment inverter 212 and inverter 214 are differential inverters.

In one embodiment, interpolative delay line 120 includes a plurality of inverters 212 and 214 that are serially coupled, a plurality of interpolation comparators 220, and a plurality of differential comparators 230 and 250. In such embodiment, each interpolation comparators 220 corresponds to one set of inverters 212 and 214, and each of differential comparators 230, 250 corresponds to inputs or outputs of a set of inverters 212 and 214.

Single-end to differential converter 241 receives clock input 140 from clock 142. Clock input 140 is separated into complementary components 242 and 244 using single-end to differential converter 241. Differential clock input 205, which includes clock component signals 242 and 244, is provided to delay stage 210, interpolative comparator 220, and differential comparator 230.

Summer 232 of differential comparator 230 receives differential component 244 and sums differential component 244 with itself to produce output 233. Summer 234 of differential comparator 230 receives differential component 242 and sums differential component 242 with itself to produce output 235. Comparator 238 compares output 233 with output 235 and generates single-ended, delayed output signal 262. The delay amount of delayed output signal 262 is dependent upon the delay caused by differential comparator 230. In one embodiment, when the value of output 233 exceeds the value of output 235, delayed output signal 262 is asserted. In another embodiment, when the value of output 235 exceeds the value of output 233, delayed output signal 262 is asserted.

Delay stage 210 receives differential component 242 and differential component 244 from single-end to differential converter 241 and delay control signals 284 from delay control unit 280. Delay stage 210 may be, for example, a differential inverter. In one embodiment, delay control signals 284 are provided to delay stage 210 to adjust the amount of delay of delayed clock output signals 150. Inverter 212 of delay stage 210 receives differential component 242 and a delay control signal 284, and inverter 214 of delay stage 210 receives differential component 244 and a delay control signal 284. Inverter 212 inverts differential component 242 and outputs inverted differential component 246, whose delay amount (delay unit) is dependent upon the delayed control signals 284. Inverter 214 inverts differential component 244 and outputs inverted differential component 248, whose delay amount is also dependent upon delayed control signals 284. Differential clock output signal 249, which includes inverted differential component 246 and inverted differential component 248, are provided to interpolative comparator 220 and differential comparator 250.

Summer 252 of differential comparator 250 receives inverted differential component 246 and sums inverted differential component 246 with itself to produce output 253. Summer 254 of differential comparator 250 receives inverted differential component 248 and sums inverted differential component 248 with itself to produce output 255. Comparator 258 compares output 253 with output 255 and generates delayed output signal 266 (single-ended clock signal 266). Delayed output signal 266 has a delay relative to differential clock input 205 based at least in part upon the delay applied to differential component 242 and differential component 244 by delay stage 210. In one embodiment, the delay of delayed output signal 266 corresponds to a total delay of differential inverter 210 and differential comparator 250. For example, the full delay of delayed output signal 266 may be a delay of 90 picoseconds, whereas the delay between differential clock input 205 and delayed output signal 262 may be 30 picoseconds. In one embodiment, when the value of output 253 exceeds the value of output 255, comparator 258 asserts delayed output signal 266. In another embodiment, when the value of output 255 exceeds the value of output 253, comparator 258 asserts delayed output signal 266.

Summer 222 of interpolative comparator 220 receives differential component 244 and inverted differential component 246. Summer 224 of interpolative comparator receives differential component 242 and inverted differential component 248. Summer 222 sums differential component 244 with inverted differential component 246 to produce output 223. Summer 224 sums differential component 242 with inverted differential component 248 to produce output 225. Comparator 228 compares output 223 with output 225 to generate delayed output signal 264 (single-ended clock signal 264). Delayed output signal 264 has a delay relative to differential clock input 205 based upon the delay applied to differential clock input 205 by delay stage 210. In one embodiment, the delay of delayed output signal 264 corresponds to a predetermined fraction of the full delay of delayed output signal 266. For example, in one embodiment, delay control unit 280 (described further below) may control the delay of delayed output signal 264 such that it is one half of the full delay of delayed output signal 266. In one embodiment, delayed output signal 264 is indicative of a relative value of the summation of differential component 244 and inverted differential component 242, and the summation of differential component 242 and inverted differential component 244. In one embodiment, when the value of output 223 exceeds the value of output 225, delayed output signal 264 is asserted. In another embodiment, when the value of output 225 exceeds the value of output 223, delayed output signal 264 is asserted.

To assist in delay control and symmetric correction operations, delay control unit 280 receives loop filter output signals 165 from loop filter 160 and uses the loop filter output signals 165 to generate delay control signals 284 and delay output signals 282. Delay stage 210 uses delay control output signals 284 to adjust the amount of delay of delayed output signal 262, delayed output signal 264, and delayed output signal 266 relative to differential clock input 205. As stated previously, the delay of delayed output signal 264 may be a predetermined fraction of the delay of delayed output signal 266. In one embodiment, the delay of delayed output signal 264 is substantially equal to one half of the delay of delayed output signal 266.

In one embodiment, symmetric correction unit 270 receives delay output signals 282, inverted differential component 246, and inverted differential component 248. In one embodiment, symmetric control unit 270 is coupled to the delay stage 210 to control when a transition occurs for each of the differential clock output signals and the differential clock input signals. In one embodiment, symmetric correction unit 270 uses delay output signals 282, inverted differential component 246, and inverted differential component 248 to correct for error in the symmetry of inverted differential component 246 and inverted differential component 248. In one embodiment, correcting for error in symmetry of inverted differential component 246 and inverted differential component 248 corrects for error in symmetry of output 225 and output 223, as is shown in FIG. 5. In addition, the correction in symmetry of inverted differential component 246 and inverted differential component 248 allows the delay of delayed output signal 264 to be aligned with one half of the delay between delayed output signal 262 and delayed output signal 266.

In one embodiment, delayed output signal 262, delayed output signal 264, and delayed output signal 266 are provided to mismatch compensator 267 for mismatch compensation. Mismatch compensator 267 receives delayed output signal 262, delayed output signal 264, and delayed output signal 266 and performs a mismatch compensation operation that compensates for delay time delineation outside of a desired delay time. For example, in one embodiment, when the desired delay time between delayed output signal 262, delayed output signal 264, and delayed output signal 266 is 30 picoseconds, yet the delay time between delayed output signal 262 and delayed output signal 264 is 30.5 picoseconds and the delay time between delayed output signal 264 and delayed output signal 266 is 29.5 picoseconds, mismatch compensator 267 may compensate for the difference in delay times by matching the delay times between each delayed output signal such that each delay time is closely matched to 30 picoseconds. Mismatch compensator 267 provides delayed clock output signals 150 as output of interpolative delay line 120.

Figure 3:
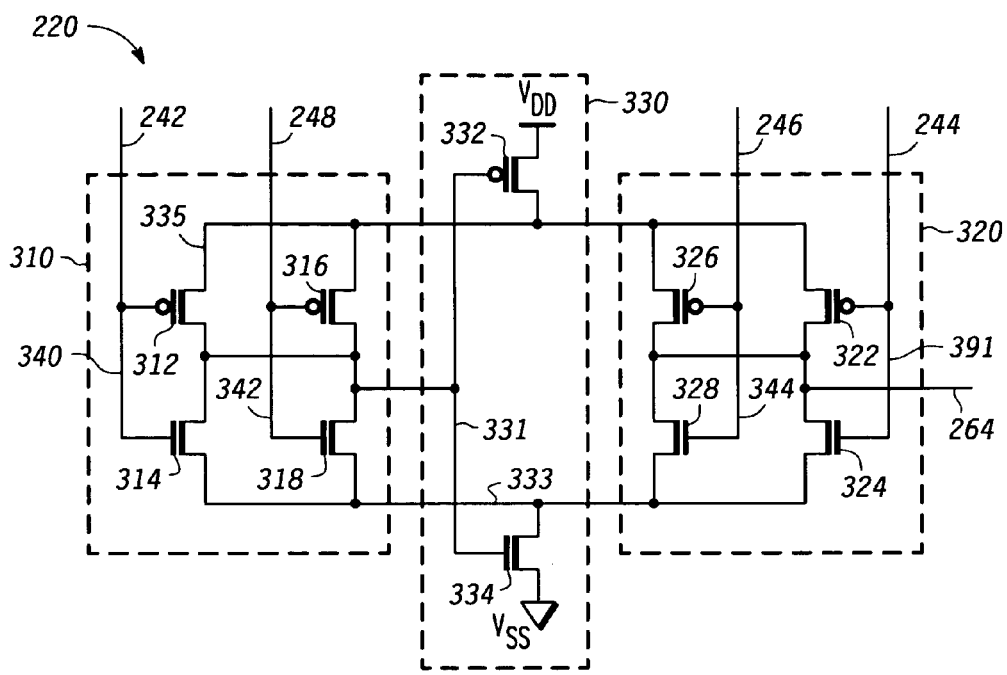
FIG. 3 illustrates, in circuit form, an interpolative comparator according to one embodiment of the present invention.

FIG. 3 illustrates interpolative comparator 220 according to one embodiment of the present invention. Interpolative comparator 220 includes adder block 310 (summing circuitry 310), current source 330, and adder block 320 (summing circuitry 320). Adder block 310 includes a PMOS transistor 312, a PMOS transistor 316, an NMOS transistor 314, and an NMOS transistor 318. Current source 330 includes a PMOS transistor 332 and an NMOS transistor 334. Adder block 320 includes a PMOS transistor 326, a PMOS transistor 322, an NMOS transistor 328, and an NMOS transistor 324.

The control electrode or terminal of PMOS transistor 312 and the control electrode of NMOS transistor 314 are coupled to receive differential component 242 at node 340. The control electrode of PMOS transistor 316 and the control electrode of NMOS transistor 318 are coupled to receive inverted differential component 248 at node 342. The control electrode of PMOS transistor 326 and the control electrode of NMOS transistor 328 are coupled to receive inverted differential component 246 at node 344. The control electrode of PMOS transistor 322 and the control electrode of NMOS transistor 324 are coupled to receive differential component 244 at node 346. First current electrodes (sometimes called current handling terminals or the like), in this case sources of PMOS transistors 312, 316, 326, and 322 are coupled to the second current electrode (the drain) of PMOS transistor 332 at node 335. The second current electrodes (sources) of NMOS transistors 314, 318, 328, and 324 are coupled to the first current electrode (drain) of NMOS transistor 334 at node 333. The control electrode of PMOS transistor 332 and the control electrode of NMOS transistor 334 are coupled to the drains of transistors 312, 316, 314 and 318 at node 331. The source of PMOS 332 is coupled to VDD. The source of NMOS transistor 334 is coupled to ground Vss. The drains of transistors 328, 324, 326 and 322 are coupled to provide delayed output signal 264.

Adder block 310 receives differential component 242 from clock 140 and inverted differential component 248 from inverter 214. In one embodiment, PMOS transistor 312 and NMOS transistor 314 receive differential component 242 at node 340, and PMOS transistor 316 and NMOS transistor 318 receive inverted differential component 248 at node 342. PMOS transistor 312, NMOS transistor 314, PMOS transistor 316, and NMOS transistor 318 of adder block 310 combine to add differential component 242 and inverted differential component 248. Output signal 223 which represents the summation of differential component 242 and inverted differential component 248 is provided to current source 330 at node 335 and node 333. In addition, adder block 310 provides an input voltage signal to current source 330 at node 331. The control electrodes of PMOS transistor 332 and NMOS transistor 334 receive the input voltage signal, and provide current to node 335 and node 333 based upon the voltage of the input voltage signal.

To assist in the comparator operation of interpolative comparator 220, the voltage input signal provided to node 331 dictates the amount of current provided by current source 330 to node 335 and node 335. That is, PMOS transistor 332 of current source 330 provides current to node 335 based upon the amount of voltage provided to the control electrode of PMOS transistor 332. Similarly, NMOS transistor 332 of current source 330 provides current to node 333 based on the amount of voltage provided to the control electrode of NMOS transistor 334.

Adder block 320 receives differential component 244 from clock 140 and inverted differential component 246 from inverter 212. In one embodiment, PMOS transistor 322 and NMOS transistor 324 receive differential component 244 at node 346. PMOS transistor 326 and NMOS transistor 328 receive inverted differential component 246 at node 344. PMOS transistor 322, NMOS transistor 324, PMOS transistor 326, and NMOS transistor 328 of adder block 320 combine to add differential component 244 and inverted differential component 246. Output signal 225 which represents the summation of differential component 244 and inverted differential component 246 is provided to node 335 and node 333. In addition, adder block 320 provides delayed output signal 264 to node 391.

Figure 4:
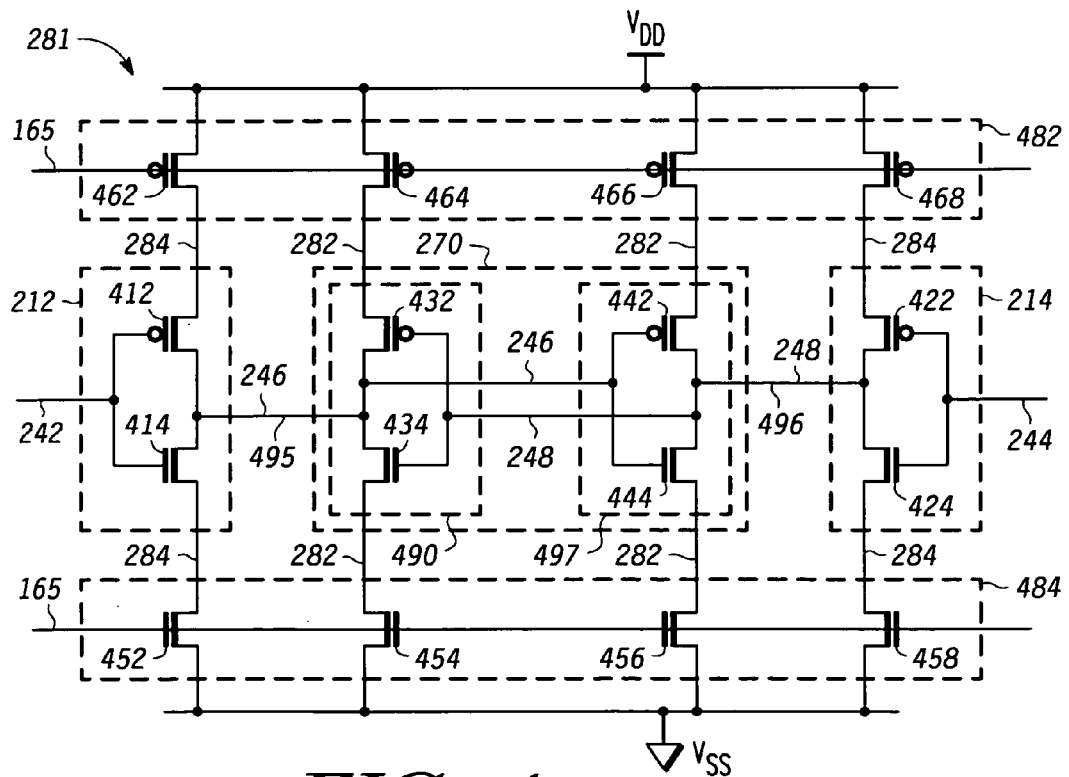
FIG. 4 illustrates, in circuit form, a symmetric delay unit, according to one embodiment of the present invention.

FIG. 4 illustrates symmetric delay unit 281 according to one embodiment of the present invention. Symmetric delay unit 281 includes delay control unit 280, symmetric correction unit 270, and delay stage 210. Delay control unit 280 includes PMOS delay control unit 482 and NMOS delay control unit 484. PMOS delay control unit 482 includes a PMOS transistor 462, a PMOS transistor 464, a PMOS transistor 466, and a PMOS transistor 468. NMOS delay control unit 482 includes an NMOS transistor 452, an NMOS transistor 454, an NMOS transistor 456, and an NMOS transistor 458. Symmetry correction unit 270 includes inverter 490 cross-coupled to inverter 492. Inverter 490 includes PMOS transistor 432 and NMOS transistor 434. Inverter 492 includes PMOS transistor 442 and NMOS transistor 444. Delay stage 210 includes inverter 212 and inverter 214. Inverter 212 includes a PMOS transistor 412 coupled to an NMOS transistor 414. Inverter 214 includes a PMOS transistor 422 and an NMOS transistor 424.

In one embodiment, inverter 490 may be a weak inverter and inverter 492 may be a weak inverter. For example, in one embodiment, the width of the transistors of inverter 490 and inverter 492 may be smaller than the width of the transistors of inverter 212 and inverter 214. In one embodiment, PMOS transistor 432, NMOS transistor 434, PMOS transistor 442, and NMOS transistor 444 of symmetric correction unit 270 are smaller in size than PMOS transistor 412, NMOS transistor 414, PMOS transistor 422, and NMOS transistor 424 of delay stage 210. In one embodiment, the width of the transistors of inverter 490 and inverter 492 may be one quarter smaller than the width of the transistors of inverter 212 and inverter 214.

In one embodiment, delay control unit 280 provides delay control signals 284 to delay stage 210 and delay output signals 282 to symmetric correction unit 270. The first current electrodes of PMOS transistor 462, PMOS transistor 464, PMOS transistor 466, and PMOS transistor 468 of PMOS delay control unit 482 are coupled to receive voltage VDD. The control electrodes of PMOS transistor 462, PMOS transistor 464, PMOS transistor 466, and PMOS transistor 468 are coupled to receive loop filter output 165. The second current electrode of PMOS transistor 462 is coupled to provide delay control signal 284 to the first current electrode of PMOS transistor 312 of inverter 212. The second current electrode of PMOS transistor 468 is coupled to provide delay control signal 284 to the first current electrode of PMOS transistor 422 of inverter 214. The second current electrode of PMOS transistor 464 is coupled to provide delay output signal 282 to the first current electrode of PMOS transistor 432 of inverter 490. The second current electrode PMOS transistor 466 is coupled to provide delay output signal 282 to the first current electrode of PMOS transistor 442 of inverter 492.

The second current electrodes of NMOS transistor 452, NMOS transistor 454, NMOS transistor 456, and NMOS transistor 458 of NMOS delay control unit 482 are coupled to ground VSS. The first current electrode of NMOS transistor 452 is coupled to provide delay control signal 284 to the second current electrode of NMOS transistor 414. The first current electrode of NMOS transistor 458 is coupled to provide delay control signal 284 to the second current electrode of NMOS transistor 424. The first current electrode of NMOS transistor 454 is coupled to provide delay output signal 282 to the second current electrode of NMOS transistor 434. The first current electrode of NMOS transistor 456 is coupled to provide delay output signal 282 to the second current electrode of NMOS transistor 444. The control electrodes NMOS transistor 452, NMOS transistor 454, NMOS transistor 456, and NMOS transistor 458 are coupled to receive loop filter output 165.

The control electrodes of PMOS transistor 412 and NMOS transistor 414 of inverter 212 are coupled to receive differential component 242 from clock 142. The first current electrode of PMOS transistor 412 is coupled to receive delay control signal 284 at the second current electrode of PMOS transistor 462. The second current electrode of NMOS transistor 414 is coupled to receive delay control signal 284 at the first current electrode of NMOS transistor 452. The second current electrode of PMOS transistor 412 and the first current electrode of NMOS transistor 414 are coupled to cross-coupled inverters 490 and 492 at node 495. In one embodiment, delay control signals 284 provided at the second current electrode of PMOS transistor 462 and the first current electrode of NMOS transistor 452 are used to adjust the delay of inverted differential component 246.

The control electrodes of PMOS transistor 422 and NMOS transistor 424 of inverter 422 are coupled to receive differential component 244 from clock 142. The first current electrode of PMOS transistor 422 is coupled to receive delay control signal 284 at the second current electrode of PMOS transistor 468. The second current electrode of NMOS transistor 424 is coupled to receive delay control signal 284 at the first current electrode of NMOS transistor 458. The second current electrode of PMOS transistor 422 and the first current electrode of NMOS transistor 424 are coupled to provide inverted differential component 248 to cross-coupled inverters 490 and 492 at node 496. In one embodiment, delay control signals 284 provided at the second current electrode of PMOS transistor 468 and the first current electrode of NMOS transistor 458 are used to adjust the delay of inverted differential component 248.

In one embodiment, symmetry correction unit 270 receives delay output signals 282 from PMOS delay control unit 482 and NMOS delay control unit 484, and inverted differential component 246 and inverted differential component 248 from delay stage 210. The first current electrode of PMOS transistor 432 is coupled to receive delay output signal 282 at the second current electrode of PMOS transistor 464. The second current electrode of NMOS transistor 434 is coupled to receive delay output signal 282 at the first current electrode of NMOS transistor 454. The control electrodes of PMOS transistor 432 and NMOS transistor 434 are coupled to the second current electrode of PMOS transistor 442, the first current electrode of NMOS transistor 444, the second current electrode of PMOS transistor 422, and the first current electrode of NMOS transistor 424 at node 496.

The first current electrode of PMOS transistor 442 is coupled to receive delay output signal 282 at the second current electrode of PMOS transistor 466. The second current electrode of NMOS transistor 444 is coupled to receive delay output signal 282 at the first current electrode of NMOS transistor 456. The control electrodes of PMOS transistor 442 and NMOS transistor 444 are coupled to the second current electrode of PMOS transistor 432, the first current electrode of NMOS transistor 434, the second current electrode of PMOS transistor 412, and the first current electrode of NMOS transistor 414 at node 495. In one embodiment, inverted differential component 246 at node 495 is adjusted to be symmetric with inverted differential component 248 at node 496 using the delay output signals 282 provided at the second current electrode of PMOS transistor 464, the first current electrode of NMOS transistor 454, the second current electrode of PMOS transistor 466, and the first current electrode of NMOS transistor 456. In one embodiment, transition symmetry circuitry 270 controls when a transition occurs for each of the differential clock output signals (inverted differential component 246 and inverted differential component 248) and the differential clock input signals (differential component 242 and differential component 244). In one embodiment, differential component 242 and differential component 244 are transitioned such that the midpoints of their slopes are approximately equal. In one embodiment, inverted differential component 246 and inverted differential component are transitioned such that the midpoints of their slopes are approximately equal.

FIG. 5 illustrates differential component signal 242, differential component signal 244, inverted differential component 248, inverted differential component 246, the summation signal of differential component signal 242 and inverted differential component 248, the summation signal of differential component signal 244 and inverted differential component signal 246, delayed output signal 262, delayed output signal 264, and delayed output signal 266 in accordance with one embodiment of the present invention.

Note that the various hardware units and circuitry described throughout the application can be reused or shared by various functions Note that the comparator circuitry performing the comparator operations, such as, differential comparator 230, interpolative comparator 220, and differential comparator 250, may be any comparator circuitry that performs the comparator operations described herein. In one embodiment, interpolative comparator 220, differential comparator 230, and differential comparator 250 are internally substantially similar. Embodiments of the present invention can be implemented in hardware, software, or in a combination of both. For example, some embodiments may be implemented by a finite state machine having control circuitry with microcode to control execution of the state machine. Alternatively, software code may be used to perform the above functions. In addition, delay locked loop 110 may be a synthesizable circuit encoded on a computer-readable medium using a hardware description language.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In one embodiment of the present invention, an apparatus includes a delay locked loop (DLL) with fractional stage delay. The DLL includes a delay stage, a fractional stage delay compare circuit, and a full stage delay compare circuit. The delay stage is coupled to receive a differential clock input signal and coupled to provide a differential clock output signal. The fractional stage delay compare circuit is coupled to receive both the differential clock output signal and the differential clock input signal, and to provide a first single-ended clock signal having a first delay relative to the differential clock input signal. The full stage delay compare circuit is coupled to receive one of the differential clock output signal and the differential clock input signal and is coupled to provide a second single-ended clock signal having a second delay relative to the differential clock input signal.

In one embodiment, a circuit includes a delay locked loop (DLL) with interpolation delay. The DLL includes a differential inverter, an interpolation circuit, and a differential compare circuit. The differential inverter is coupled to receive a differential clock signal and coupled to provide an inverted differential clock signal. The interpolation circuit is coupled to receive both the clock signal and the inverted clock signal, and to provide an interpolated clock signal having a first delay relative to the clock signal. The differential compare circuit is coupled to receive the inverted clock signal and coupled to provide a non-interpolated clock signal having a second delay relative to the clock signal. The second delay corresponds to a full delay of the differential inverter and the first delay corresponds to a predetermined fraction of the full delay.

In one embodiment of the present invention, a method for providing clock signals is presented. A differential clock signal is provided to a delay circuit. The delay circuit includes a plurality of series-coupled delay stages. Each delay stage delays the clock signal by a delay unit and inverts the clock signal. A plurality of differential delay stage output signals is provided. A single-ended clock signal is provided for each differential delay stage output signal. Interpolation occurs between pairs of the differential delay stage clock signals. An interpolated single-ended clock signal is provided for each delay stage.

In one embodiment, an apparatus includes a differential clock signal delay circuit, a plurality of series-coupled delay stages, a first means for providing for each delay stage a single-ended clock signal, and a second means for providing for each delay stage an interpolated single-ended clock signal. The differential clock signal delay circuit includes the plurality of series-coupled delay stages. Each delay stage is configured to delay a delay stage input signal by a delay unit and to invert the delay stage input signal to provide a delay stage output signal. The first means for providing, for each delay stage, a single-ended clock signal responsive to receiving one of the differential delay stage output signal or the differential delay stage input signal for each delay stage. The second means for providing, for each delay stage, the interpolated single-ended clock signal responsive to receiving both of the differential delay stage output signal or the differential delay stage input signal for each delay stage.

In one embodiment, a circuit includes a first circuit means, a second circuit means, and a third circuit means. The first circuit means is for summing a first signal and a second signal. The second circuit means is for summing a third signal and a fourth signal. The third circuit means is for comparing the sum of the first and second signals and the sum of the third and fourth signals. The first and third signals are complementary signals of a first differential signal. The second and fourth signals are complementary signals of a second differential signal. The second differential signal is a delayed inversion of the first differential signal.

The transistors described herein (whether bipolar, field effect, etc.) may be conceptualized as having a control terminal which controls the flow of current between a first current handling terminal and a second current handling terminal. An appropriate condition on the control terminal causes a current to flow from/to the first current handling terminal and to/from the second current handling terminal.

For example, in a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current flowing between the base and emitter causes an emitter-to-collector current to flow.

Also, although field effect transistors (FETs) are frequently discussed as having a drain, a gate, and a source, in most such devices the drain is interchangeable with the source. This is because the layout and semiconductor processing of the transistor is frequently symmetrical. For an n-channel FET, the current handling terminal normally residing at the higher voltage is customarily called the drain.

The current handling terminal normally residing at the lower voltage is customarily called the source. A sufficient voltage on the gate (relative to the source voltage) causes a current to therefore flow from the drain to the source. The source voltage referred to in n-channel FET device equations merely refers to which drain or source terminal has the lower voltage at any given point in time. For example, the "source" of the n-channel device of a bi-directional CMOS transfer gate depends on which side of the transfer gate is at the lower voltage. To reflect this symmetry of most n-channel FET devices, the control terminal may be deemed the gate, the first current handling terminal may be termed the "drain/source", and the second current handling terminal may be termed the "source/drain". Such a description is equally valid for a p-channel FET device, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable.

Insulated gate FETs (IGFETs) are commonly referred to as MOSFET devices (which literally is an acronym for "Metal-Oxide-Semiconductor Field Effect Transistor"), even though the gate material may be polysilicon or some material other than metal, and the dielectric may be oxynitride, nitride, or some material other than an oxide. The use of such historical legacy terms as MOSFET should not be interpreted to literally specify a metal gate FET having an oxide dielectric unless the context indicates that such a restriction is intended.

Regarding the signals described herein, those skilled in the art will recognize that a signal may be directly transmitted from a first logic block to a second logic block, or a signal may be modified (e.g., amplified, attenuated, delayed, buffered, inverted, filtered or otherwise converted or even latched) between such logic blocks. Although signals of the above described embodiment may be characterized as transmitted from one block to the next, coupling between blocks may be done in various embodiments of the invention so as to include modified signals in place of such directly transmitted signals as long as the informational and/or functional aspect of the signal is transmitted between blocks. To some extent, a signal input at a second logic block may be conceptualized as a second signal derived from a first signal output from a first logic block due to physical limitations of the circuitry involved (e.g., there will inevitably be some attenuation and delay). Therefore, as used herein and for ease of discussion, a signal between logic blocks includes a second signal derived from a first signal, the first signal, and/or any modifications to the first signal, whether due to circuit limitations or due to passage through other circuit elements which do not substantially change the informational and/or final functional aspect of the first signal.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "coupled", to each other to achieve the desired functionality.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless otherwise indicated by the context, adjectives such as "first" and "second" are merely used to arbitrarily distinguish between the elements such terms modify. The identification of an element as a "first element" (e.g., a first apparatus or a first step) does not necessarily make such element more important than a "second element." The identification of a first element does not necessarily mean an action was taken with respect to the first element before another or similar action was taken with respect to a second element. Thus, the terms "first" and "second" are not used to technically or temporally distinguish between elements unless the context indicates otherwise. In such a context, the terms "first" and "second" are not meant to add a novel or otherwise distinguishing feature, but rather, solely to arbitrarily identify them in a non-limiting way (e.g., a "first element" is different from a "second element" only with regard to any further characterizations specified in the claim regarding the elements, and need not be any different than any other element before known, disclosed in the present application, or later developed, solely as a result of the use of the term "first," the point of novelty being set forth elsewhere in the claim).

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus comprising a delay locked loop (DLL) with fractional stage delay, the DLL comprising:
   a delay stage coupled to receive a differential clock input signal and coupled to provide a differential clock output signal;
   a fractional stage delay compare circuit coupled to receive both the differential clock output signal and the differential clock input signal, and to provide a first single-ended clock signal having a first delay relative to the differential clock input signal; and
   a full stage delay compare circuit coupled to receive one of the differential clock output signal and the differential clock input signal and coupled to provide a second single-ended clock signal having a second delay relative to the differential clock input signal.

2. The apparatus of claim 1 wherein the DLL further comprises:
   a second full stage delay compare circuit coupled to receive the other one of the differential clock output signal or the differential clock input signal, and to provide a third single-ended clock signal having a third delay, the third delay being different from the second delay of the second single-ended clock signal by at least an amount of delay of the delay stage.

3. The apparatus of claim 1 wherein:
   the full stage delay compare circuit is coupled to receive the differential clock output signal; and
   the first delay is a predetermined fraction of the second delay.

4. The apparatus of claim 3 wherein the first delay is substantially equal to one half of the second delay.

5. The apparatus of claim 1 wherein the fractional stage delay compare circuit and the full stage delay compare circuit have substantially matched output impedances.

6. The apparatus of claim 1 wherein each of the differential clock output signal and the differential clock input signal comprise first and second complementary signals, the fractional stage delay compare circuit comprising:
   first summing circuitry comprising a first input coupled to receive the first complementary signal of the differential clock input signal and a second input coupled to receive the second complementary signal of the differential clock output signal; and
   second summing circuitry comprising a first input coupled to receive the second complementary signal of the differential clock input signal and a second input coupled to receive the first complementary signal of the differential clock output signal.

7. The apparatus of claim 6 wherein the fractional stage delay compare circuit further comprises:
   a comparator coupled to provide a signal indicative of a relative value of a sum of the first complementary signal of the differential clock input signal and the second complementary signal of the differential clock output signal, and a sum of the second complementary signal of the differential clock input signal and the first complementary signal of the differential clock output signal.

8. The apparatus of claim 7 wherein the first summing circuitry comprises a plurality of transistors and the comparator comprises a plurality of transistors, and at least one transistor is in both of the pluralities of transistors.

9. The apparatus of claim 6 wherein the full stage delay compare circuit is a first one of first and second full stage delay compare circuits, the DLL further comprising the second full stage delay compare circuit, wherein
   the first full stage delay compare circuit comprises:
      first summing circuitry comprising first and second inputs, each, of the inputs being coupled to receive the first complementary signal of the differential clock input signal; and
      second summing circuitry comprising first and second inputs, each of the inputs being coupled to receive the second complementary signal of the differential clock input signal; and
   the second full stage delay compare circuit comprising:
      first summing circuitry comprising first and second inputs, each of the inputs being coupled to receive the first complementary signal of the differential clock output signal; and
      second summing circuitry comprising first and second inputs, each of the inputs being coupled to receive the second complementary signal of the differential clock output signal.

10. The apparatus of claim 6 wherein the full stage delay compare circuit comprises:
   first summing circuitry comprising first and second inputs, each of the first and second inputs being coupled to receive the first complementary signal of the differential clock output signal; and
   second summing circuitry comprising first and second inputs, each of the first and second inputs being coupled to receive the second complementary signal of the differential clock output signal.

11. The apparatus of claim 10 wherein each of the first summing circuitry and the second summing circuitry comprises:
   a first transistor of a first type, the first transistor of a first type comprising a control terminal coupled to the first input of the respective summing circuitry;
   a first transistor of a second type, the first transistor of the second type comprising a control terminal coupled to the first input of the respective summing circuitry and a current handling terminal coupled to a current handling terminal of the first transistor of the first type;

a second transistor of the first type, the second transistor of the first type comprising a control terminal coupled to the second input of the respective summing circuitry; and a second transistor of the second type, the second transistor of the second type comprising a control terminal coupled to the second input of the respective summing circuitry and a current handling terminal coupled to a current handling terminal of the first transistor of the first type.

12. The apparatus of claim 1 wherein the delay stage is a differential buffer comprising:

a first inverter coupled to receive a first complementary signal of the differential clock input signal and to provide a first complementary signal of the differential clock output signal; and a second inverter coupled to receive a second complementary signal of the differential clock input signal and to provide a second complementary signal of the differential clock output signal.

13. The apparatus of claim 1 wherein the DLL further comprises:

a transition symmetry control circuit, the transition symmetry control circuit coupled to the delay stage to control when a transition occurs for each of the differential clock output signal and the differential clock input signal.

14. The apparatus of claim 13 wherein the transition symmetry control circuit comprises:

cross-coupled invertors coupled between complementary signals of the differential clock output signal, each inverter comprising transistors having smaller sizes than transistors of the delay stage.

15. The apparatus of claim 1 wherein the DLL further comprises:

a delay line comprising:
the delay stage;
the fractional stage delay compare circuit;
the full stage delay compare circuit; and
a delay control circuit coupled to the delay stage, the delay control circuit providing at least one control signal to the delay stage to control an amount of delay of the delay stage;

a phase detector coupled to the delay line; and a filter coupled to receive an indication of phase from the phase detector, and coupled to provide control signals to the delay control circuit of the delay line responsive to the indication of phase.

16. The apparatus of claim 1 further comprising an integrated circuit, the integrated circuit comprising the DLL.

17. The apparatus of claim 1 further comprising a computer-readable medium, wherein the DLL is a synthesizable circuit encoded on the computer-readable medium using a hardware description language.

18. A circuit comprising a delay locked loop (DLL) with interpolation delay, the DLL comprising:

a differential inverter coupled to receive a differential clock signal and coupled to provide an inverted differential clock signal;

an interpolation circuit coupled to receive both the clock signal and the inverted clock signal, and to provide an interpolated clock signal having a first delay relative to the clock signal; and a differential compare circuit coupled to receive the inverted clock signal and coupled to provide a non-interpolated clock signal having a second delay relative to the clock signal, wherein the second delay corresponds to a full delay of the differential inverter and the first delay corresponds to a predetermined fraction of the full delay.

19. The circuit of claim 18 wherein the differential inverter comprises:

a first inverter coupled to receive a first complementary signal of the differential clock signal and to provide a first complementary signal of the differential inverted clock signal; and a second inverter coupled to receive a second complementary signal of the differential clock signal and to provide a second complementary signal of the inverted clock signal.

20. The circuit of claim 19 wherein the DLL further comprises:

a first weak inverter having an input coupled to an input of the first inverter of the differential inverter and an output coupled to an output of the second inverter of the differential inverter; and a second weak inverter having an input coupled to an input of the second inverter of the differential inverter and an output coupled to an output of the first inverter of the differential inverter, each of the first and second weak inverters having a smaller size than each of the first and second inverters of the differential inverter.

21. The circuit of claim 18 wherein the interpolation circuit comprises:

a first differential pair of transistors comprising inputs coupled to receive the first complementary signal of the differential clock signal and the first complementary signal of the inverted differential clock signal, and comprising an output; and a second differential pair of transistors comprising inputs coupled to receive the second complementary signal of the differential clock signal and the second complementary signal of the differential inverted clock signal, and comprising an output coupled to the output of the first differential pair.

22. The circuit of claim 21 wherein the first and second differential pair transistors are N-type FETs, the interpolation circuit further comprising:

a first differential pair of P-type FETs, each P-type FET comprising a current handling terminal coupled to a current handling terminal of a corresponding N-type FET of the first differential pair of N-type FETs and comprising a control terminal coupled to receive one of the first complementary signal of the differential clock input signal and the second complementary signal of the differential clock output signal; and a second differential pair of P-type FETs, each P-type FET comprising a current handling terminal coupled to a current handling terminal of a corresponding N-type FET of the second differential pair of N-type FETs and comprising a control terminal coupled to receive one of the second complementary signal of the differential clock input signal and the first complementary signal of the differential clock output signal.

23. The circuit of claim 18 wherein the interpolation circuit and the differential compare circuit are internally substantially similar.

24. The circuit of claim 18 wherein the interpolation circuit comprises:

comparator circuitry coupled to provide a signal indicative of a relation between a sum of the first complementary signal of the differential clock signal and the second complementary signal of the inverted differential clock signal, and a sum of the second complementary signal of the differential clock signal and the first complementary signal of the inverted differential clock signal.

25. The circuit of claim 18 wherein
the predetermined fraction is substantially equal to one half; and
the interpolation circuit and the differential compare circuit have substantially matched output impedances.

26. The circuit of claim 18 wherein the DLL further comprises a delay line comprising:
a plurality of serial-coupled differential inverters;
a plurality of interpolation circuits, each interpolation circuit corresponding to one differential inverter;
a plurality of differential compare circuits, each differential compare circuit corresponding to one of an input or an output of a differential inverter.

27. The circuit of claim 26 wherein the DLL further comprises:
a delay control circuit coupled to each differential inverter, the delay control circuit providing at least one control signal to the delay line to select delay of the differential inverters;
a phase detector comprising an input coupled to an input to the delay line and an input coupled to an output of the delay line; and
a filter coupled to receive an indication of phase from the phase detector, and coupled to provide at least one control signal to the delay control circuit responsive to the indication of phase.

28. A method for providing clock signals comprising:
providing a differential clock signal to a delay circuit, the delay circuit including a plurality of series-coupled delay stages, each delay stage delaying the clock signal by a delay unit and inverting the clock signal;
providing a plurality of differential delay stage output signals;
providing, for each differential delay stage output signal, a single-ended clock signal;
interpolating between pairs of the differential delay stage clock signals;
providing, for each delay stage, an interpolated single-ended clock signal.

29. The method of claim 28 wherein the interpolating comprises:
receiving a differential delay stage input signal and a differential delay stage output signal, each of the differential signals comprising first and second complementary signals;
summing the first complementary signal of the differential delay stage input signal with the second complementary signal of the differential delay stage output signal to provide a first sum;
summing the second complementary signal of the differential delay stage input signal with the first complementary signal of the differential delay stage output signal to provide a second sum;
comparing the first and second sums; and
providing the interpolated single-ended clock signal responsive to the comparing.

30. The method of claim 28 further comprising:
controlling an amount of symmetry exhibited by complementary signal transitions occurring for each differential delay stage output signal.

31. The method of claim 28 further comprising:
detecting a phase difference between an input signal to the delay control circuit and an output signal from the delay control circuit; and
adjusting the unit of delay responsive to detecting the phase difference.

32. An apparatus comprising:
a differential clock signal delay circuit comprising a plurality of series-coupled delay stages, each delay stage configured to delay a delay stage input signal by a delay unit and to invert the delay stage input signal to provide a delay stage output signal;
first means for providing, for each delay stage, a single-ended clock signal responsive to receiving one of the differential delay stage output signal or the differential delay stage input signal for each delay stage;
second means for providing, for each delay stage, an interpolated single-ended clock signal responsive to receiving both of the differential delay stage output signal and the differential delay stage input signal for each delay stage.

33. The apparatus of claim 32 wherein the second means comprises:
means for summing, for each delay stage, a first complementary signal of the differential delay stage input signal with a second complementary signal of the differential delay stage output signal to provide a first sum;
means for summing, for each delay stage a second complementary signal of the differential delay stage input signal with a first complementary signal of the differential delay stage output signal to provide a second sum; and
means for comparing the first and second sums for each delay stage.

34. The apparatus of claim 33 further comprising:
means for controlling an amount of symmetry exhibited by complementary signal transitions occurring for each differential delay stage output signal.

35. The apparatus of claim 34 further comprising:
means for detecting a phase difference between an input signal to the delay control circuit and an output signal from the delay control circuit; and
means for adjusting the unit of delay responsive to detecting the phase difference.

36. A circuit comprising:
first circuit means for summing a first signal and a second signal;
second circuit means for summing a third signal and a fourth signal; and
third circuit means for comparing the sum of the first and second signals and the sum of the third and fourth signals; wherein the first and third signals are complementary signals of a first differential signal, the second and fourth signals are complementary signals of a second differential signal, and the second differential signal is a delayed inversion of the first differential signal;
a differential inverter coupled to receive the first and third signals and to provide the second and fourth signals;
a plurality of differential inverters including the differential inverter;
a plurality of interpolative comparison circuits, each interpolative comparison circuit corresponding to a differential inverter and including a corresponding instance of the first, second and third circuit means, each interpolative comparison circuit being coupled to receive corresponding first, second, third and fourth signals.

37. The circuit of claim 36 further comprising:

a plurality of non-interpolative comparison circuits, each non-interpolative comparison circuit including a corresponding fourth circuit means for summing the second signal with the second signal to provide a first sum, fifth circuit means for summing the fourth signal with the fourth signal to provide a second sum, and a sixth circuit means for comparing the first and second sums.

38. The circuit of claim 37 wherein the first and fourth circuit means are substantially similar, the second and fifth circuit means are substantially similar, and the third and sixth circuit means are substantially similar.

* * * * *